US006620260B2

(12) United States Patent
Kumagai et al.

(10) Patent No.: US 6,620,260 B2
(45) Date of Patent: Sep. 16, 2003

(54) SUBSTRATE RINSING AND DRYING METHOD

(75) Inventors: Yoshio Kumagai, Nirasaki (JP); Takayuki Toshima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/858,107

(22) Filed: May 15, 2001

(65) Prior Publication Data
US 2002/0037371 A1 Mar. 28, 2002

(30) Foreign Application Priority Data
May 15, 2000 (JP) ........................................ 2000-141407

(51) Int. Cl.[7] .............................. B08B 3/00; B08B 3/04; B08B 5/00
(52) U.S. Cl. ........................ 134/26; 134/21; 134/25.4; 134/32; 134/902
(58) Field of Search ............................ 134/21, 26, 32, 134/25.4, 902

(56) References Cited

U.S. PATENT DOCUMENTS 5,911,837 A * 6/1999 Matthews ................. 134/2
5,989,359 A * 11/1999 Berbel ..................... 134/10
6,001,191 A * 12/1999 Kamikawa et al. ........ 134/32

* cited by examiner

Primary Examiner—Zeinab El-Arini
(74) Attorney, Agent, or Firm—Morrison & Foerster LLP

(57) ABSTRACT

The wafers W are dipped and rinsed in pure water in the processing bath 60, and then dichloromethane is fed into the processing bath 60, thereby changing the state of the wafer W from being dipped in pure water to being dipped in dichloromethane. Thereafter, the wafers W is raised up to the drying chamber 61, and dichloromethane remained on the surface of each wafer W is evaporated, and the hot $N_2$ gas is discharged onto the wafers W. Thereby, no water marks are produced, and no resist is dissolved, and the substrate can be dried in safety.

8 Claims, 19 Drawing Sheets

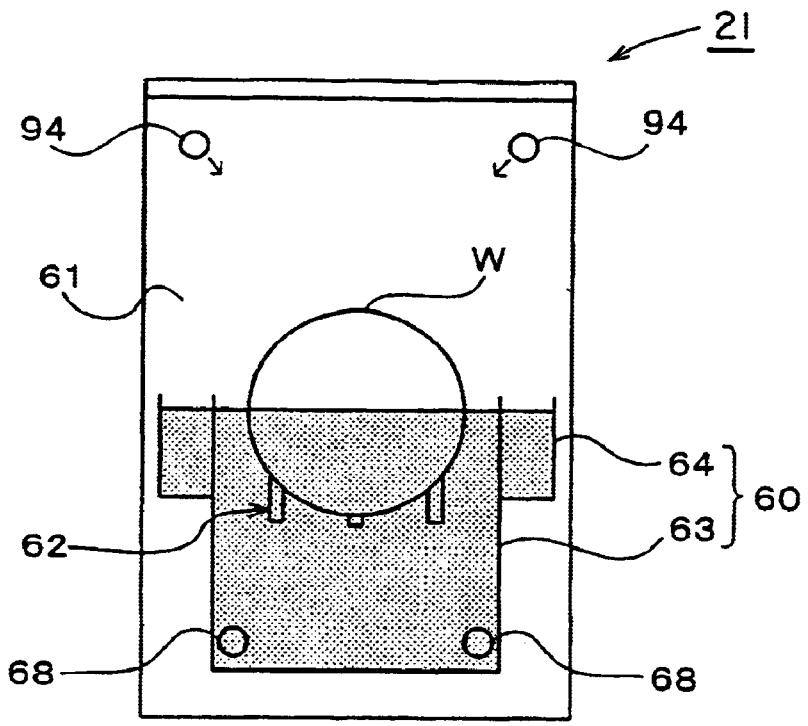
F I G. 9
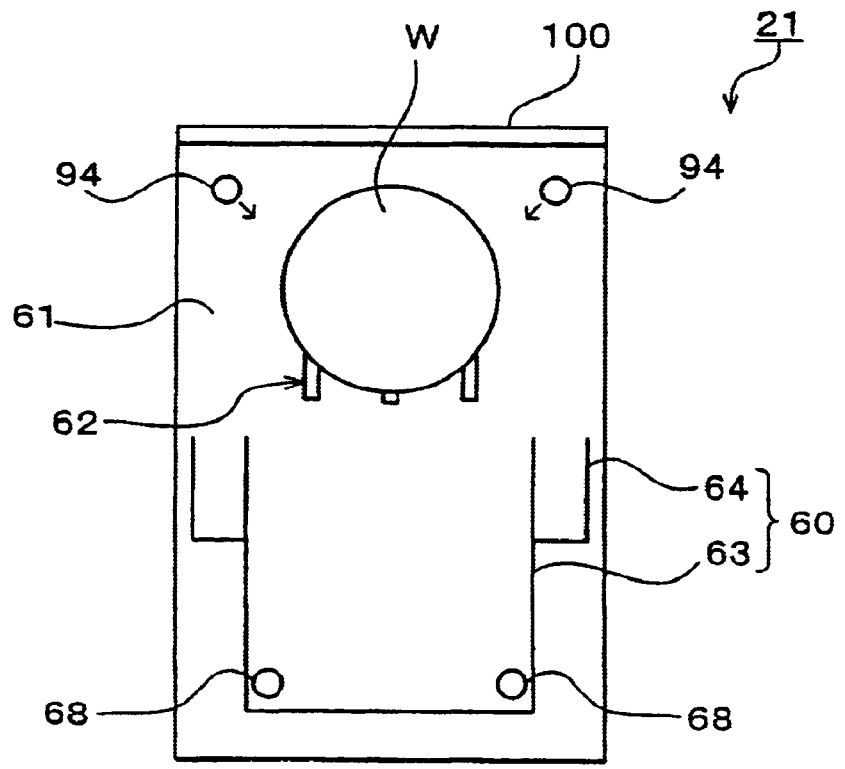
F I G. 10

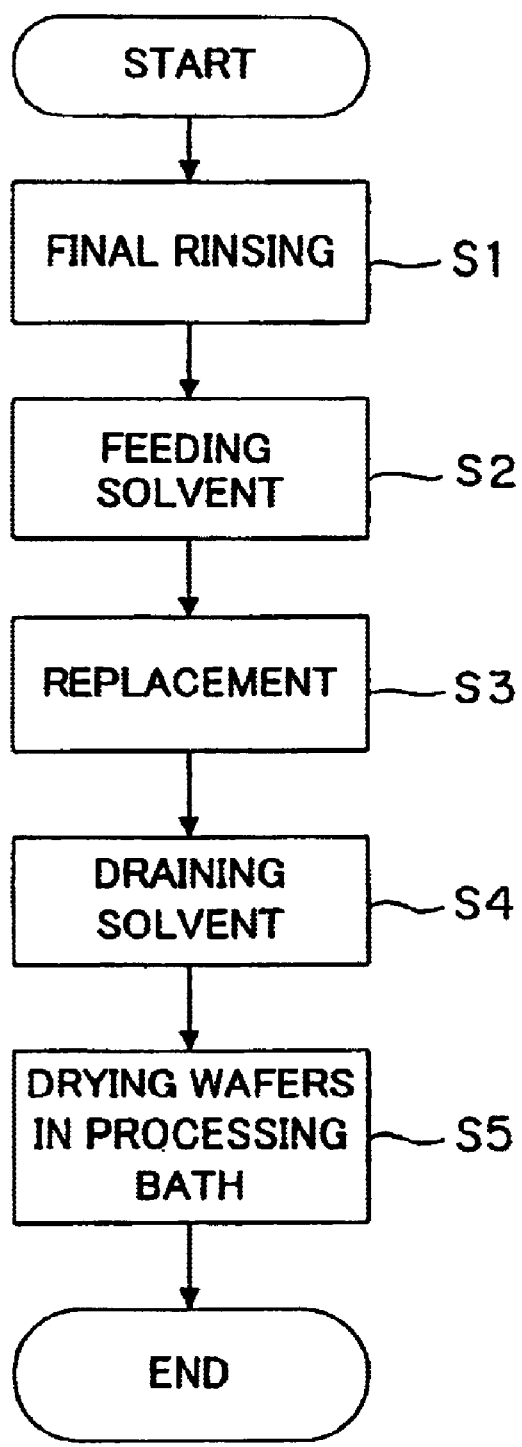
F I G. 12

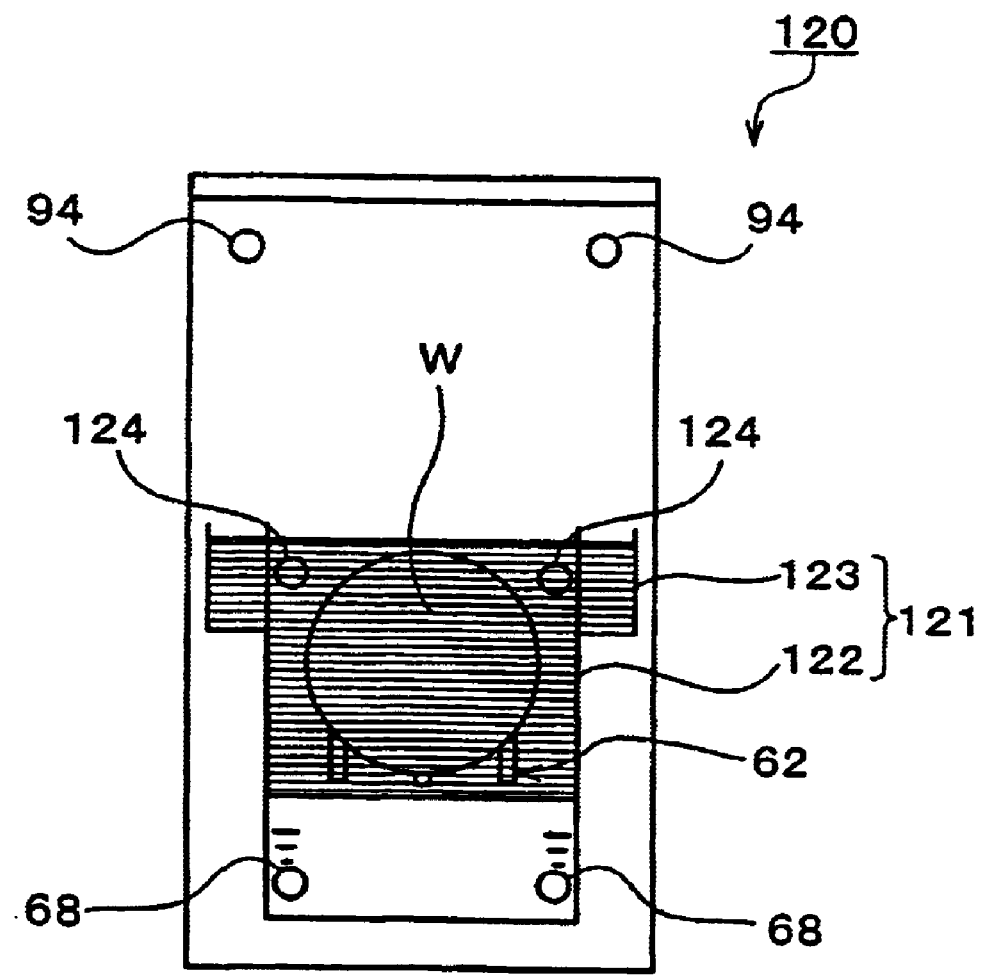
F I G. 21

SUBSTRATE RINSING AND DRYING METHOD

BACKGROUND OF THE INVENTION

1. Field of the Invention

The present invention relates to a substrate processing method and a substrate processing apparatus for processing a substrate.

2. Description of the Related Art

In the manufacturing process of a semiconductor device, various types of cleaning systems are employed in order to clean a semiconductor wafer (hereinafter referred to as "wafer") using a cleaning liquid such as a chemical liquid and pure water, thereby removing contamination such as particles, organic contaminants, and metallic impurities, which adhere to the surface of the wafer. As one of the above cleaning systems, a wet-type cleaning system, which cleans wafers by submerging them in a cleaning liquid stored in a cleaning bath, is widespread.

Such a cleaning system performs: a cleaning process using a chemical solution mainly composed of ammonium, hydrochloric acid and fluoride acid and also using pure water; a final rinsing process using pure water; and a drying process. The cleaning system has a final rinse cleaning unit that performs the final rinsing process and a drying unit that performs the drying process.

These drying units execute, for example, an IPA vapor drying method. In the IPA vapor drying method, vapor of IPA [isopropyl alcohol: $(CH_3)_2CHOH$ ], which has a high hydrophilic property, is fed onto a wafer contained in a drying chamber. Waterdrops remaining on the wafer surface are removed with volatilization of IPA, and thus the wafer is dried.

When conveying the wafer from the final rinse cleaning unit to the drying unit, the wafer surface is exposed to the air, and thus waterdrops remaining on the wafer surface are likely to be dried, producing water marks. Furthermore, the final rinse cleaning unit and the drying unit are arranged side by side, thus a large footprint is required.

With the goal of avoiding generation of water marks and reducing footprint, a rinsing/drying unit that performs both the final rinsing process and the drying process has been introduced. The rinsing/drying unit is configured so that, after completion of the final rinsing process, IPA vapor is fed when pulling up a wafer submerged in pure water stored in a cleaning bath, thereby drying the wafer by Mangorani effect stemming from the difference in surface tension between water and IPA.

However, the conventional drying device and the rinsing/drying device employ IPA, which has a property of dissolving a resist. When IPA vapor or IPA liquid is fed onto a wafer surface provided with a resist film formed according to a predetermined circuit pattern, the surface of the resist film is dissolved and the pattern might be broken. Furthermore, with the memory circuit, in the event that a dual gate for suppressing a leakage current is formed on the wafer and has a structure of locally depositing the resist film for patterning, if IPA vapor is fed to it, the dual gate is changed in thickness, and the operation of the circuit thus may be adversely affected. Furthermore, since IPA contains an alcoholic component, there is a risk of fire. As a result, sufficient safety measures and facilities are required.

Furthermore, in order to achieve the Mangorani effect sufficiently, the wafer must be raised from pure water slowly, and a considerable amount of time is thus required to move the wafer upward. In addition, a wafer guide is provided with a plurality of grooves to hold the periphery of each wafer. Water also remains in the grooves and narrow regions between the wafer periphery engaged in the grooves and on the groove surfaces. Unlike the exposed wafer surface, IPA vapor hardly reaches into these narrow regions, and thus they are hardly dried.

SUMMARY OF THE INVENTION

Therefore, an object of the present invention is to provide a substrate processing method and apparatus that can process a substrate safely, without producing water marks and without breaking a pattern of a resist film formed on the substrate.

To accomplish the above objective, the present invention provides a substrate processing method including the steps of: placing a substrate in a first processing liquid stored in a processing bath; feeding a second processing liquid different in specific gravity from the first processing liquid into the processing bath, thereby forming a first layer of the first processing liquid and a second layer of the second processing liquid with an interface being formed therebetween; and causing a relative movement of the interface and the substrate so that the substrate passes through the interface and the substrate locates on a second layer side of interface.

The relative movement of the interface and the substrate may be produced by draining the first liquid from the processing bath while feeding the second processing liquid into the processing bath.

When the specific gravity of the second processing liquid is smaller than the specific gravity of the first processing liquid, the relative movement of the interface and substrate may also be produced by moving the substrate upward.

The aforementioned method may further include a step of positioning the substrate outside the second layer and drying the substrate, after the substrate has passed through the interface by the relative movement of the interface and the substrate.

Preferably, the method according to the present invention can be used for processing a substrate having a resist film formed on the surface of the substrate. In such a case, preferably, the second processing liquid has a property of not-dissolving the resist film. The second processing liquid is preferably incombustible.

When the second processing liquid is fed, a third processing liquid may be fed, the third processing liquid being substantially insoluble in the first and the second processing liquids and having a specific gravity between those of the first and the second processing liquids is fed, thereby a third layer of the third processing liquid is formed along the interface between the first layer and the second layer, whereby the interface enters into a first layer side in the neighborhood of the point where the interface contacts the substrate.

Alternatively, the second processing liquid may be fed in a heated state into the processing bath, thereby the second layer enters into a first layer side in the neighborhood of the point where the interface contacts the substrate.

The present invention also provides a substrate processing apparatus for processing a substrate in a processing bath, which includes: a substrate holder that holds the substrate in the processing bath, a first processing liquid feed nozzle that feeds the first processing liquid into the processing bath, and a second processing liquid feed nozzle that feeds a second processing liquid different in specific gravity from the first processing liquid into the processing bath.

The substrate processing apparatus is preferably structured so that it further includes a first processing liquid draining means for draining the first processing liquid from the processing bath and a second processing liquid draining means for draining the second processing liquid from the processing bath.

The substrate holder is preferably movable up and down between inside the processing bath and above the processing bath.

Furthermore, the substrate processing apparatus is preferably structured so that it further includes a gas feeding means for feeding a gas that promotes drying the substrate.

BRIEF DESCRIPTION OF THE DRAWINGS

FIG. 9 is an illustration explaining the fifth step of the process performed by the rinsing/drying unit shown in FIG. 2;

FIG. 10 is an illustration explaining the sixth step of the process performed by the rinsing/drying unit shown in FIG. 2;

FIG. 12 is a flow chart showing the processing procedure executed in the rinsing/drying unit shown in FIG. 11;

FIG. 21 is an illustration explaining an alternative of the third step of the process performed by the rinsing/drying unit shown in FIG. 16;

DESCRIPTION OF THE PREFERRED EMBODIMENTS

Figure 1:
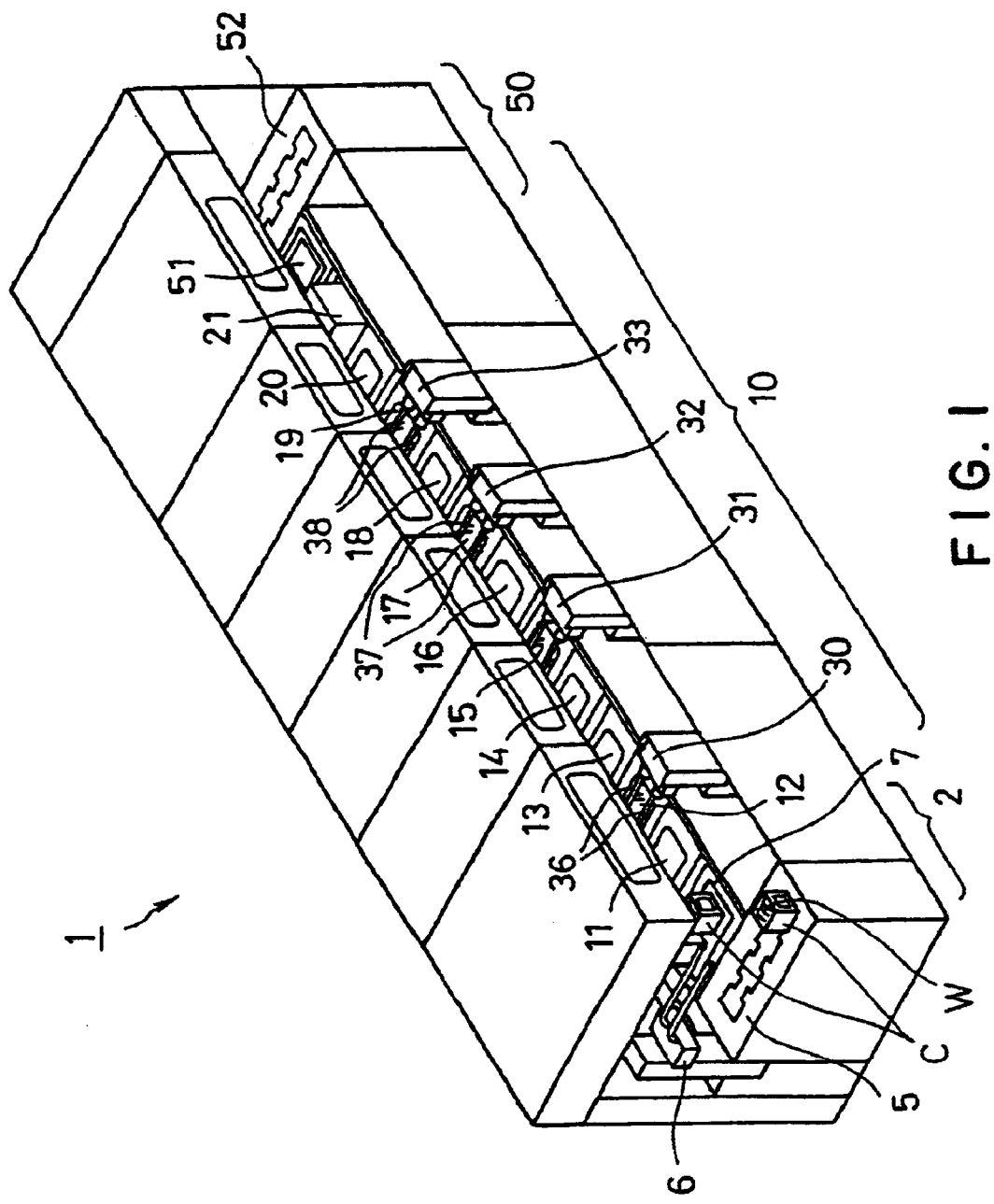
FIG. 1 is a perspective view of a cleaning system equipped with a rinsing/drying unit, which is the first embodiment of the present invention.

The preferred embodiments of the present invention will be described with reference to the accompanying drawings. FIG. 1 is a perspective view of a cleaning system 1, which includes a rinsing/drying unit 21 of the first embodiment of the present invention. The cleaning system 1 executes a process including the steps of: receiving the wafers W (substrate) contained in carriers C, carrier by carrier; cleaning the wafers W; drying the wafers W; and delivering the wafers W, carrier by carrier.

In the cleaning system 1, a receiving/sending-out section 2 executes process steps from a step of receiving a wafer carrier C storing 25 wafers W (before cleaning) to a step of sending the wafers W to cleaning place. In the receiving/sending-out section 2, the carriers C placed on a transfer stage 5 is conveyed to a loader 7 by a transfer device 6 two by two, and then the loader 7 takes out the wafers W from the carriers C.

A cleaning/drying section 10 is provided with: a wafer chuck cleaning/drying unit 11 that cleans and dries a wafer chuck 36 of a transfer device 30 for transferring the wafers W; wafer cleaning units 12 to 15 that clean the wafers W using cleaning liquids such as various chemical liquids and pure water; a wafer chuck cleaning/drying unit 16 that cleans and dries a wafer chuck 37 of a transfer device 32; wafer cleaning units 17 to 19; a wafer chuck cleaning/drying unit 20 that cleans and dries wafer chucks 38 of a transfer device 33; and a rinsing/drying unit 21 that performs a final rinse cleaning process (rinsing treatment) and drying process for the wafers cleaned by the wafer cleaning units 12 to 15 and 17 to 19. The above units are arranged in the above order relative to the receiving/sending-out section 2. The transfer devices 30, 31, 32, and 33 are arranged on the front of the cleaning/drying unit 10 (the front side of FIG. 1).

The wafer cleaning units 12, 14, 17, and 19 are structured so as to perform chemical liquid cleaning (chemical liquid treatment), and the wafer cleaning units 13, 15, and 18 are structured so as to execute rinsing, so that chemical liquid cleaning and rinsing are alternately executed according to the general cleaning process.

In one embodiment, the wafer cleaning unit 12 executes SPM cleaning using SPM (a mixed solution of $H_2SO_4$ and $H_2O_2$), which is a cleaning liquid mainly containing a sulfuric acid, and thus removes impurities such as organic contaminants deposited on the surface of each wafer W. The wafer cleaning unit 14 executes SC1 cleaning using APM (a mixed solution of $NH_4OH$, $H_2O_2$, and $H_2O$), which is a cleaning liquid mainly containing an ammonium, and thus removes impurities such as organic contaminants and particles adhering to the surface of each wafer W. The wafer cleaning unit 17 executes SC2 cleaning using HPM (a mixed solution of HCl, $H_2O_2$ and $H_2O$), which is a cleaning liquid mainly containing a hydrochloric acid, and thus removes metallic ions adhering to the surface of each wafer W. The wafer cleaning unit 19 executes DHF cleaning using DHF (a mixed solution of HF and $H_2O$), which is a cleaning liquid mainly containing a fluoride acid, and thus removes an oxide film formed on the surface of each wafer W. The wafer cleaning units 13, 15, and 18 rinse the wafers W using pure water.

The arrangement and combinations of the wafer cleaning units 12 to 15 and 17 to 19 can optionally be changed depending on the kind of cleaning process for the wafers W. For example, one of the cleaning units may be omitted, or a cleaning unit, which cleans the wafers W with another kind of chemical liquid, may be added.

In a loading/delivery section 50, twenty-five wafers W cleaned and dried by the cleaning/drying unit 10 are stored in the carrier C, and then the wafers W are delivered carrier by carrier. In the loading/delivery section 50, an unloader 51 puts the cleaned wafers W into a carrier C, and the carrier C storing the cleaned wafers W is transferred to a delivery unit 52 by means of a transfer device, not shown.

Figure 2:
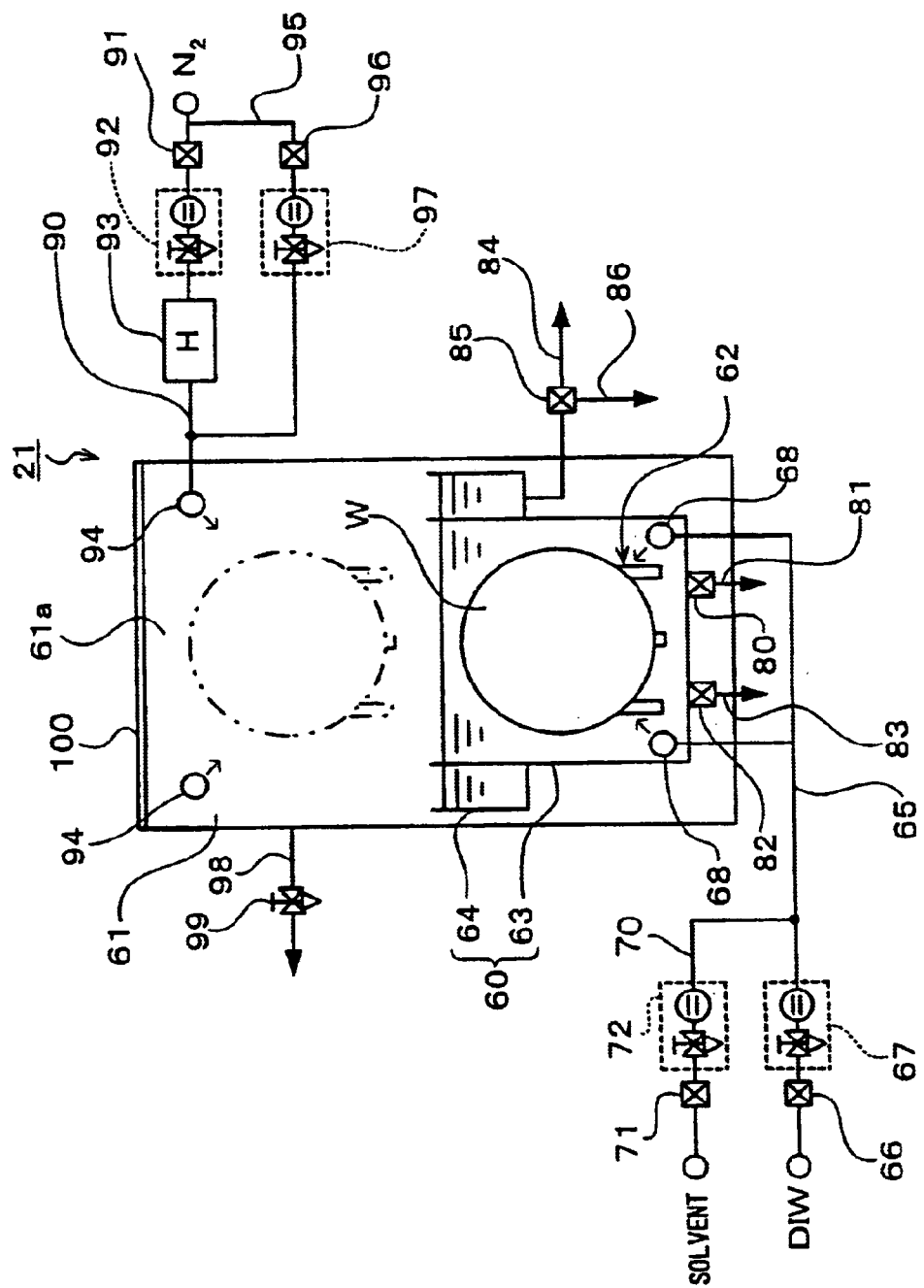
FIG. 2 is a piping flow diagram of the rinsing/drying unit shown in FIG. 1.

Next, the structure of the rinsing/drying unit 21, as the first embodiment of the present invention, will be described. As shown in FIG. 2, the rinsing/drying unit 21 has a processing bath 60 for rinsing the wafers W, a drying chamber 61 for drying the wafers W arranged above the processing bath 60, and a wafer guide 62 as a means for holding the wafers W.

The processing bath 60 composed of a box-shaped inner bath 63, which is large enough to store the wafers W, and an outer bath 64. A pure water feed circuit 65 as a first processing liquid feed means for feeding pure water (DIW) as a first processing liquid is connected to the processing bath 60. The inlet of the pure water feed circuit 65 is connected to a pure water feed source, not shown. An open-close valve 66 and a flow rate controller 67 are provided in the pure water feed circuit 65. An outlet of the pure water feed circuit 65 is connected to jet nozzles 68, 68, which are arranged in pairs at the bottom portion of the inner bath 63.

Connected to the pure water feed circuit 65 is a solvent feed circuit 70 as a second processing liquid feed means for feeding a solvent as a second processing liquid. An inlet of the solvent feed circuit 70 is connected to a solvent feed source, not shown. An open-close valve 71 and a flow rate controller 72 are provided in the solvent feed circuit 70.

Dichloromethane or HMDS (hexamethyldisilazane), which is different in specific gravity from pure water and has hydrophobic property, is used for the solvent. Although dichloromethane and HMDS are volatile, they contain no flammable component such as alcohol, thus even if vaporized, they are safe. In addition, these solvents do not dissolve a resist film. Thus, in the event that a resist film is formed on the wafer surface according to a predetermined circuit pattern, even if such a wafer W is submerged in dichloromethane or HMDS, the surface of the resist film is not dissolved, thus preventing breakage of the circuit pattern.

A pure water drain pipe 81, as a first processing liquid draining means, is connected to the bottom of the inner bath 63 via an open-close valve 80. A solvent drain pipe 83, as a second processing liquid ejection means, is also connected to the inner bath 63 via an open-close valve 82.

Connected to the bottom of the outer bath 64 is a pure water drain pipe 84, to which a solvent drain pipe 86 is connected via a three-way valve 85. Pure water stored in the inner bath 63 can be discharged through the pure water drain pipe 81, and switching the three-way valve 85 to the pure water drain pipe side allows pure water stored in the outer bath 64 to be discharged through the pure water drain pipe 84. The solvent in the inner bath 63 can be discharged through the solvent drain pipe 83, and switching the three-way valve 85 to the solvent drain pipe side allows solvent stored in the outer bath 64 to be discharged through the solvent drain pipe 83.

An $N_2$ gas feed circuit 90, as a gas feed means for feeding $N_2$ (nitrogen) gas at normal temperature or hot $N_2$ gas, is connected to the drying chamber 61.

Connected to the inlet of the $N_2$ gas feed circuit 90 is an $N_2$ gas feed source (not shown) for feeding $N_2$ gas at normal temperature. An open-close valve 91, a flow rate controller 92, and a heater 93 for heating $N_2$ gas are provided, in that order, in the $N_2$ gas feed circuit 90. The outlet of the $N_2$ gas feed circuit 90 is connected to gas nozzles 94, 94 arranged in pairs at the top portion of the drying chamber 61. A bypass circuit 95 is connected to the $N_2$ gas feed circuit 90 so that $N_2$ gas at normal temperature can be fed to the drying chamber 61 upon bypassing the heater 93. An open-close valve 96 and a flow rate controller 97 are sequentially provided in the bypass circuit 95.

An exhaust pipe 98 for discharging the atmosphere in the chamber is connected to the side wall of the drying chamber 61. A flow rate regulating valve 99 is provided at the exhaust pipe 98 in order to adjust exhaust rate through the exhaust pipe 98. A cover 100 is provided for opening or closing a transfer port 61a formed on a top of the drying chamber 61. The cover 100 is capable of vertical and horizontal movement by means of a moving mechanism, not shown.

Figure 3:
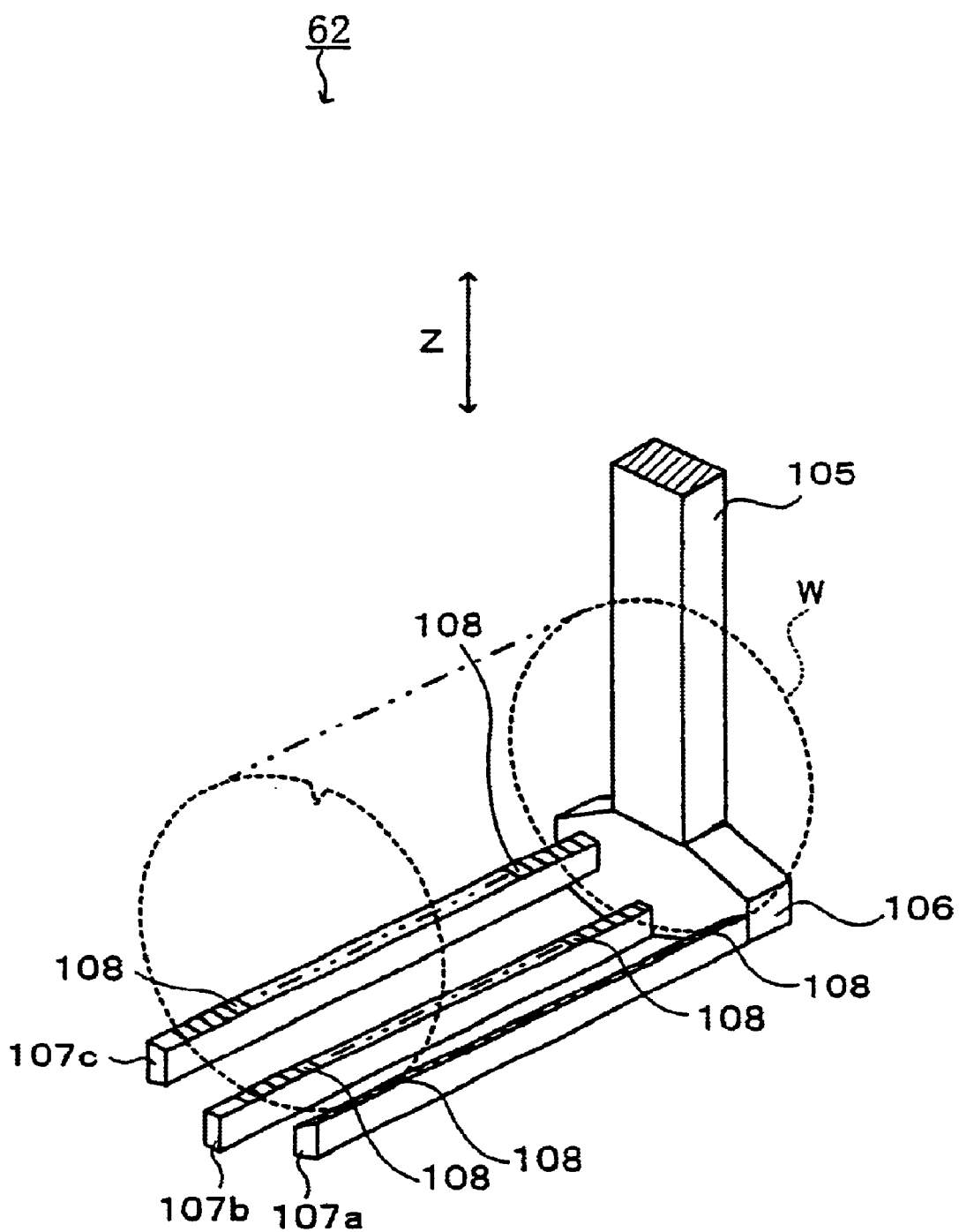
FIG. 3 is a perspective view of the wafer guide shown in FIG. 2.

The rinsing/drying unit 21 has the wafer guide 62 shown in FIG. 3. The wafer guide 62 is capable of vertical movement (movement in the Z direction as illustrated) by means of an elevating mechanism, not shown. The wafer guide 62 has a shaft portion 105, a guide portion 106, and three parallel holding members 107a, 107b and 107c horizontally fixed to the guide portion 106. On each of the holding members 107a to 107c, fifty slots 108 for holding the lower part of the periphery of each wafer W are formed at even intervals. The wafer guide 62 is capable of holding 50 wafers W arranged at even intervals and moving them up and down between the processing bath 60 and the drying chamber 61.

Next, the process according to the method of the present invention performed by the rinsing/drying unit 21 having the aforementioned structure will be explained together with the cleaning process performed by the cleaning system 1.

Firstly, a transfer robot, not shown, places the carriers C, each storing not-cleaned wafers W (for example, twenty-five wafers), on the transfer stage 5 of the receiving/sending-out section 2. Then, in the receiving/sending-out section 2, fifty wafers W stored in the two carriers C are taken out therefrom, and the transfer device 30 holds all fifty wafers at once. The wafers W are transferred to transfer devices 31, 32 and 33, in that order, and the wafers W are thus transferred to the wafer cleaning units 12–15 and 17–19, in that order. In this way, impurities such as particles adhering to the wafer surfaces are removed and cleaned. Finally, the wafers W are subjected to the final rinsing and drying process in the rinsing/drying unit 21, and they are then moved outside the cleaning system 1 from the loading/delivery section 50 carrier by carrier.

Next, the process executed by the rinsing/drying unit 21 will be described referring to the flow chart of FIG. 4 and FIGS. 6–10 illustrating process steps 1 thru 6. Here, dichloromethane (liquid phase) is used as the solvent. Dichloromethane has a greater specific gravity than that of pure water, and is hydrophobic, thus almost never mixes with pure water.

Figure 5:
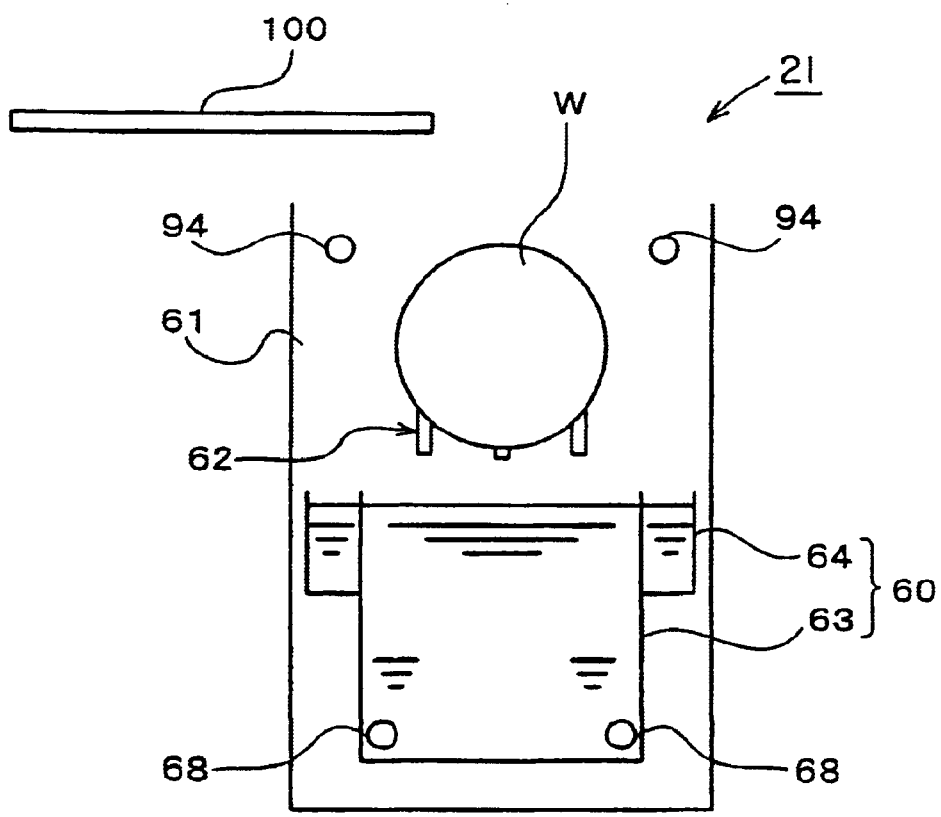
FIG. 5 is an illustration explaining the first step of the process performed by the rinsing/drying unit shown in FIG. 2.

Firstly, the cover 100 moves to open the transfer port 61a, and the wafer guide 62 moves toward the drying chamber 61. The transfer device 33 conveys the wafers W, having been subjected to DHF cleaning by the wafer cleaning unit 19, into the rinsing/drying unit 21, and transfers them to the wafer guide 62. The open-close valve 66 (shown in FIG. 2) is opened, and pure water from the pure water feed circuit 65 is fed into and fills the processing bath 60 via the jet nozzle 68 (see FIG. 5).

Figure 6:
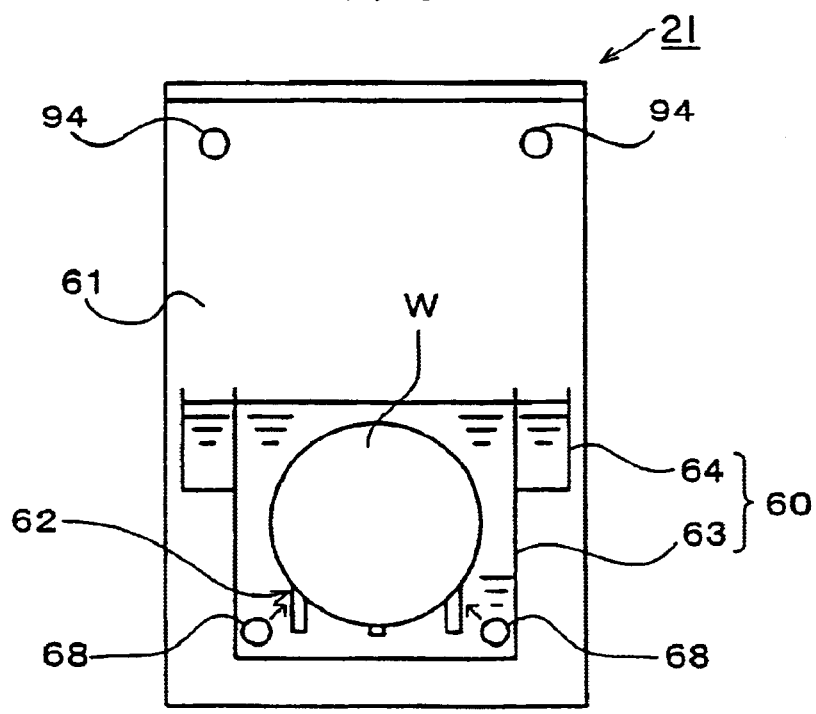
FIG. 6 is an illustration explaining the second step of the process performed by the rinsing/drying unit shown in FIG. 2.

Next, the cover 100 is closed and the wafer guide 62 moves down to position the wafers W in the processing bath 60. The wafers W are thus dipped in the pure water and are subjected to final rinsing, as shown in FIG. 6 (S1 of FIG. 4).

Figure 4:
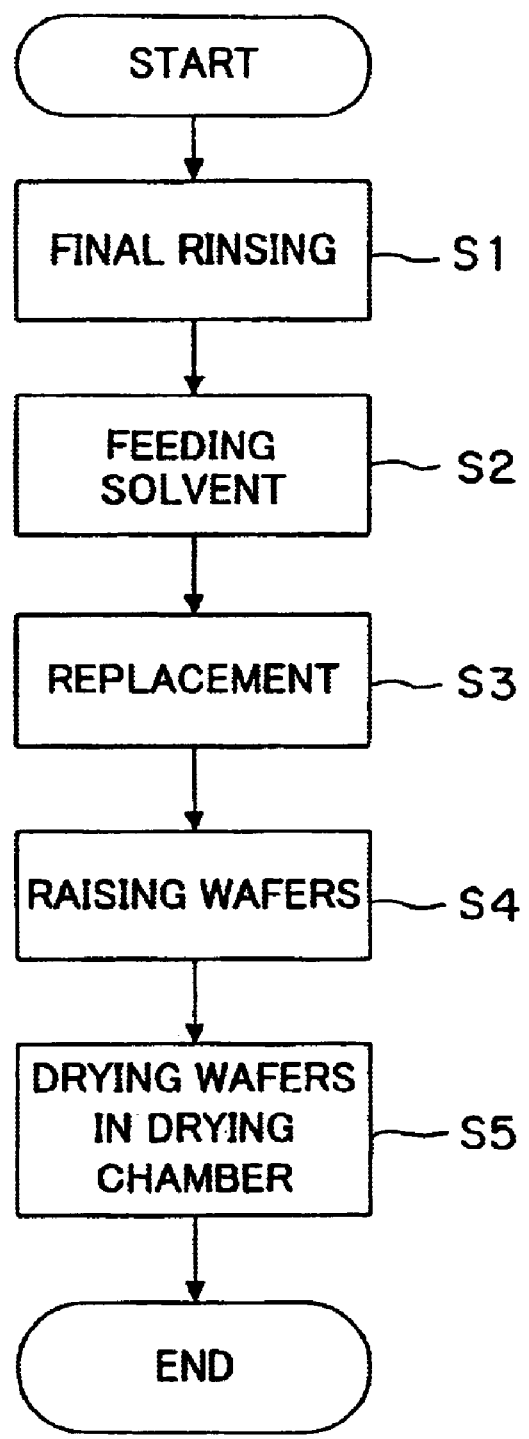
FIG. 4 is a flow chart showing the processing procedure executed in the rinsing/drying unit shown in FIG. 2.
Figure 7:
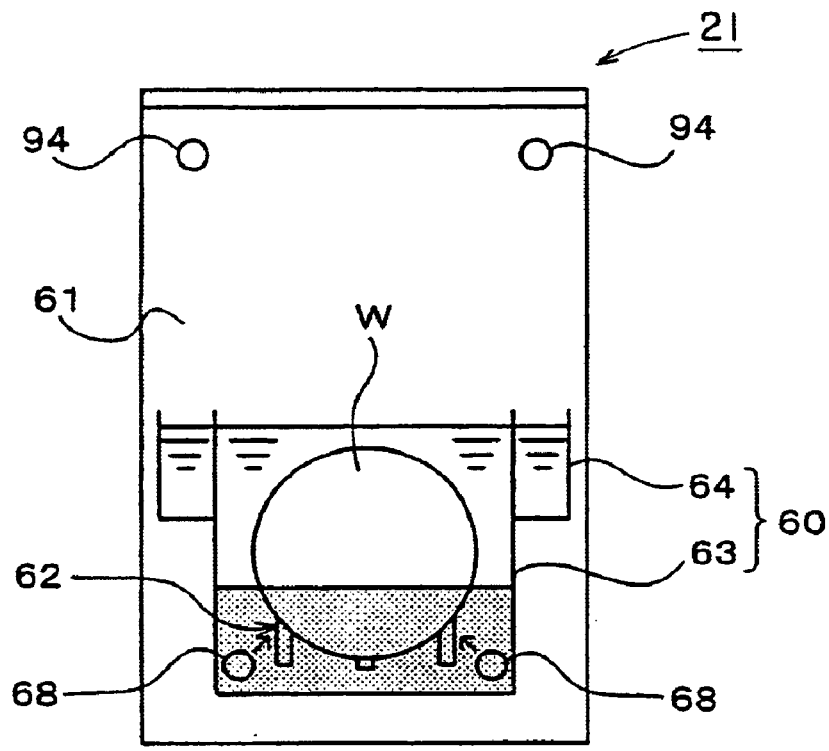
FIG. 7 is an illustration explaining the third step of the process performed by the rinsing/drying unit shown in FIG. 2.

After final rinsing, the open-close valve 66 is closed and the open-close valve 71 is opened, and thus dichloromethane is fed into the inner bath 63 through the solvent feed circuit 70, as shown in FIG. 7 (S2 of FIG. 4).

Figure 8:
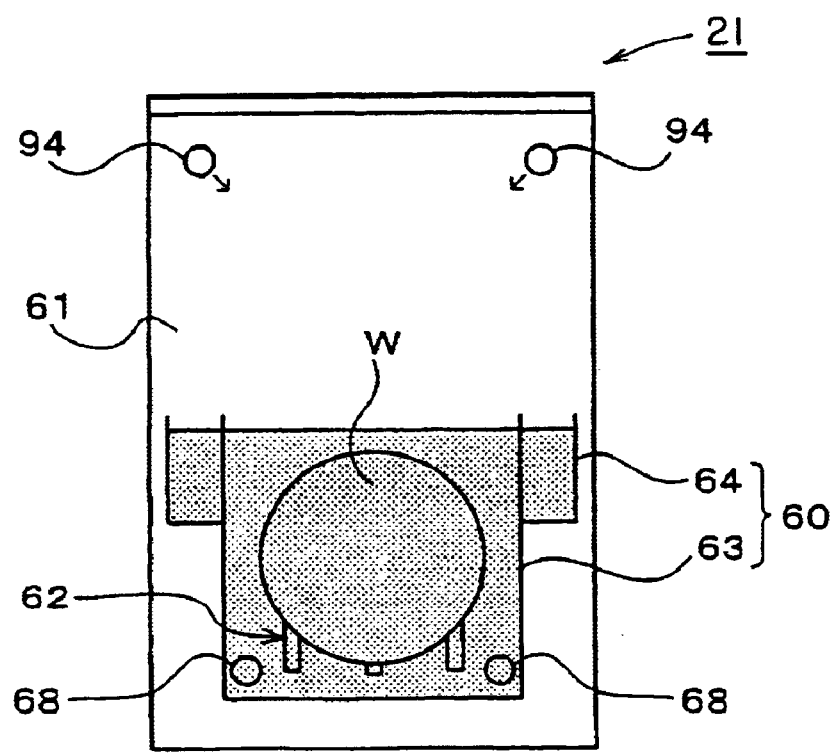
FIG. 8 is an illustration explaining the fourth step of the process performed by the rinsing/drying unit shown in FIG. 2.

As mentioned above, since dichloromethane is greater in specific gravity than pure water, dichloromethane moves down and accumulates at the bottom portion of the processing bath 60. At the same time, pure water is gradually discharged from the upper part of the processing bath 60 relative to the injection of dichloromethane, whereby a pure water layer and a dichloromethane layer are formed in the inner bath 63. Dichloromethane accumulates and the dichloromethane layer is increased in thickness, while pure water is discharged from the inner bath 63 and the pure water layer is reduced in thickness. As shown in FIG. 8, finally, the pure water that fills the inner bath 63 is entirely replaced with dichloromethane. As mentioned above, the state of wafers W is changed from a state of being submerged in pure water to a state of being submerged in dichloromethane (S3 of FIG. 4). According to the above, the pure water in contact with the wafer surface can be replaced with dichloromethane, with the wafers W being kept submerged in the liquids (i.e., pure water and dichloromethane) and without the wafers W coming into contact with the outer atmosphere (air). In addition, pure water existing on the surface of the wafer guide 62, in the slots 108, and in the narrow regions between the periphery of each wafer W engaged with the slots 108 and the surfaces of the slots, can also be easily replaced with dichloromethane. Then, the $N_2$ gas feed circuit 90 feeds $N_2$ gas at normal temperature or hot $N_2$ (nitrogen) gas, so that an inactive gas atmosphere is established in the drying chamber 61. The $N_2$ gas may be exhausted via the exhaust pipe 98 so that the atmosphere in the drying chamber 61 is filled with fresh inactive gas.

After the replacement of the liquids is completed, the wafer guide 62 moves up, as shown in FIG. 9 (S4 of FIG. 4). The wafers W are then removed from the dichloromethane and introduced into the drying chamber 61 while exposing them to the $N_2$ atmosphere. Dichloromethane remaining on the wafer surface is vaporized and the wafers W are thus dried. It is preferable to discharge $N_2$ gas at normal temperature or hot $N_2$ gas onto the surface of each wafer W, as shown in FIG. 10 (S5 of FIG. 4), thereby promoting the evaporation of dichloromethane and the drying of the wafer. After drying, discharging of $N_2$ gas at normal temperature or hot $N_2$ gas is stopped. Then, the cover 100 is opened, and a conveyer provided at the loading/delivery section 50 transfers the wafers W out of the rinsing/drying unit 21.

By use of the above rinsing/drying unit 21, water contacting the surface of each wafer W is replaced with dichloromethane without the wafers W coming into contact with air, and thereafter the wafers W, on which dichloromethane stays, are placed in the drying chamber 61. Thus, the wafers W can be dried without producing water marks, and formation of oxide film by natural oxidation due to the water marks can be prevented. This reduces defects of semiconductor devices, formed on the surface of each wafer W.

Since dichloromethane does not dissolve a resist film, the wafers W with a resist film formed can be dried appropriately. As a result, breakage of the pattern can be prevented, and defects of semiconductor devices thus can be reduced.

Furthermore, since dichloromethane does not contain flammable components such as alcohol and is fed into the processing bath 60 in a liquified state at normal temperature, there is little danger and thus high-level safety measures and facilities are not required, compared to the conventional process, in which wafers are dried using flammable IPA vapor.

Due to large heat of vaporization of dichloromethane, heat is taken from the wafers W at the time of vaporization, resulting in reduction in the surface temperature of the wafers W. It is thus possible that steam (water vapor) in the atmosphere around the wafers W is condensed and condensation is formed on the wafer surface. However, with the rinsing/drying unit 21, the drying chamber 61 (a space above the processing bath 60) is filled with an $N_2$ gas to prevent the atmosphere from containing steam, so that formation of condensation due to evaporation of dichloromethane can be prevented.

Pure water, existing in the slots 108 and in the narrow regions between the lower part of the periphery of each wafer W engaged with the slots 108 and the surface of each slot which are hardly dried in general, is replaced with dichloromethane. Therefore, when the wafers W are raised in the drying chamber 61, dichloromethane is vaporized and thus the lower part of the periphery of each wafer W can easily be dried. Furthermore, as compared with the conventional method in which the wafers W should be slowly raised from pure water into an IPA atmosphere in order to remove water by the Maragoni effect, the ascending time of the wafers W can be shortened since just raising the wafers W out of dichloromethane is required.

Figure 11:
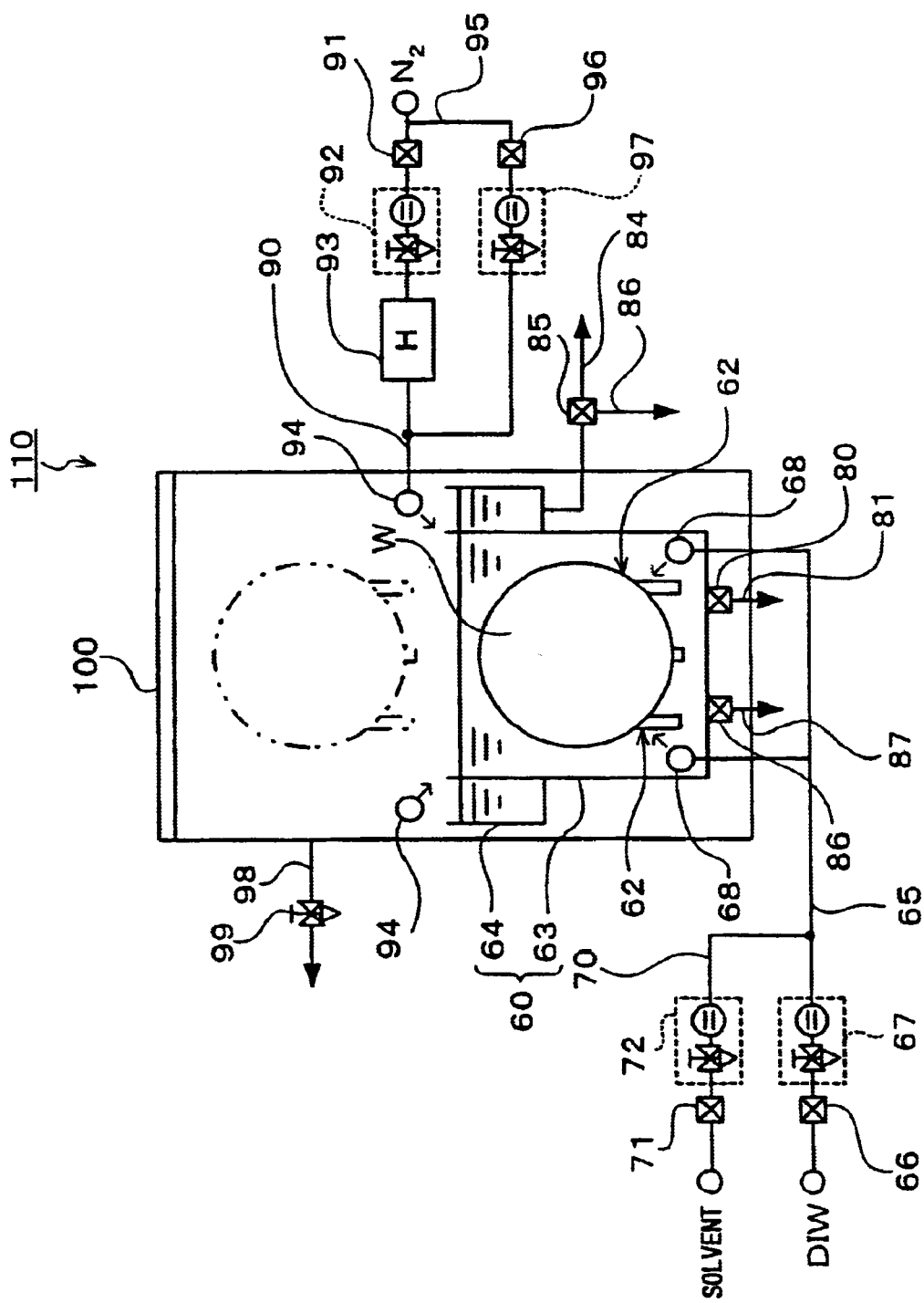
FIG. 11 is a piping flow diagram of a rinsing/drying unit, which is the second embodiment of the present invention.

Next, a rinsing/drying unit 110, which is the second embodiment of the present invention, will be explained. In the embodiment described above, the rinsing/drying unit 21 hot $N_2$ gas onto the wafers W in the drying chamber 61. However, in the second embodiment, the rinsing/drying unit 110 feeds hot $N_2$gas on to the wafers W in the processing bath 60. As shown in FIG. 11, the gas nozzles 94, 94 are arranged in pairs above the processing bath 60. The rinsing/drying unit 110 has the same structure as that of the rinsing/drying unit 21 except for the arrangement of the gas nozzles 94, 94, accordingly, the same reference numerals are assigned to the components having the same function and constitution in FIGS. 2 and 11, and duplicate explanation will be omitted.

The process of the rinsing/drying unit 110 will be explained referring to the flow chart of FIG. 12 and FIGS. 13 to 15 illustrating processing steps 1 thru 3. In this process, as in the previously described process, dichloromethane is used as the solvent.

Figure 13:
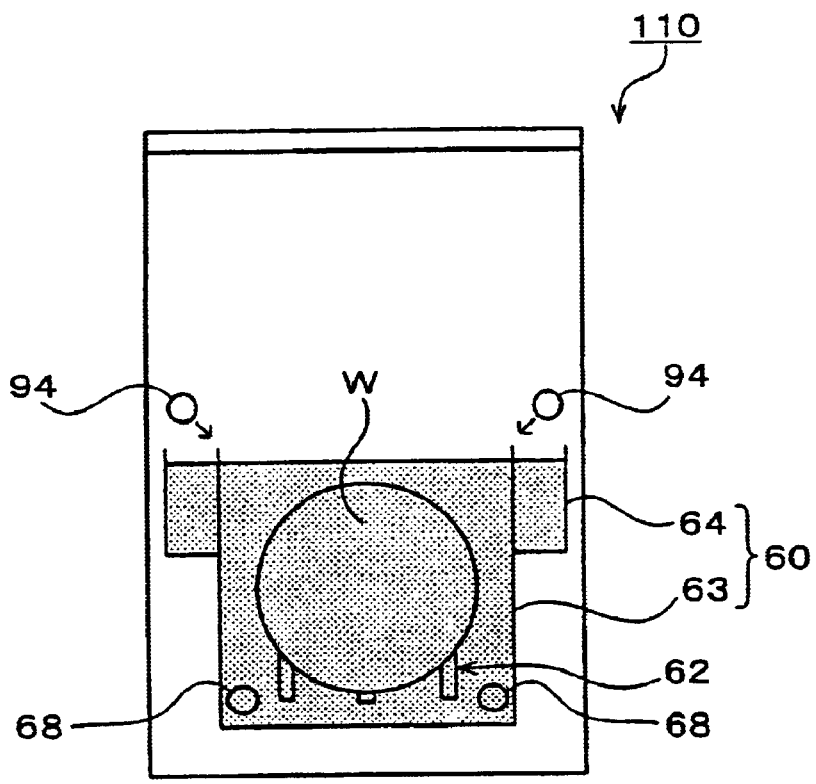
FIG. 13 is an illustration explaining the first step of the process performed by the rinsing/drying unit shown in FIG. 11.
Figure 14:
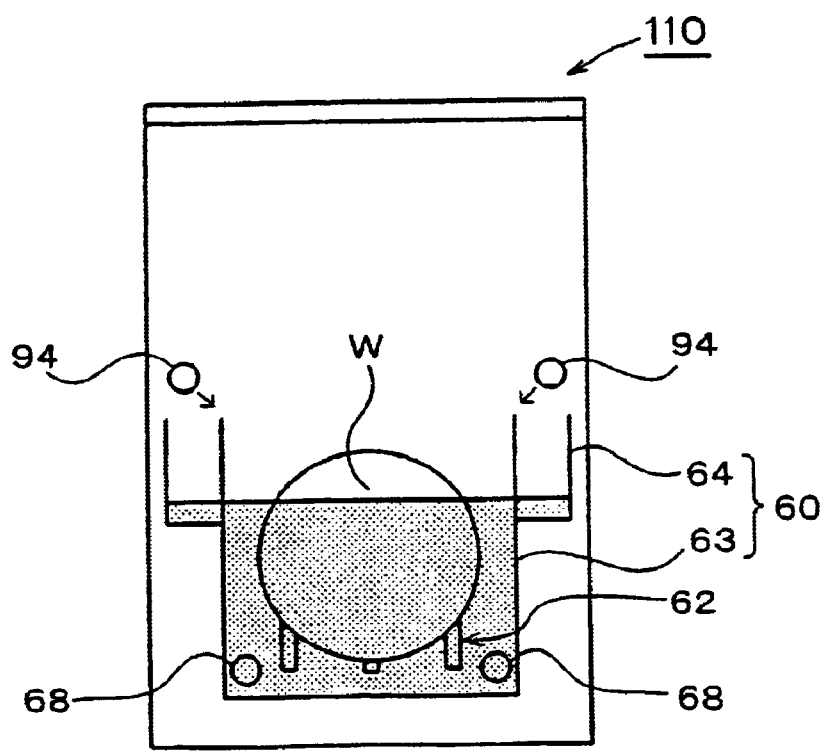
FIG. 14 is an illustration explaining the second step of the process performed by the rinsing/drying unit shown in FIG. 11.
Figure 15:
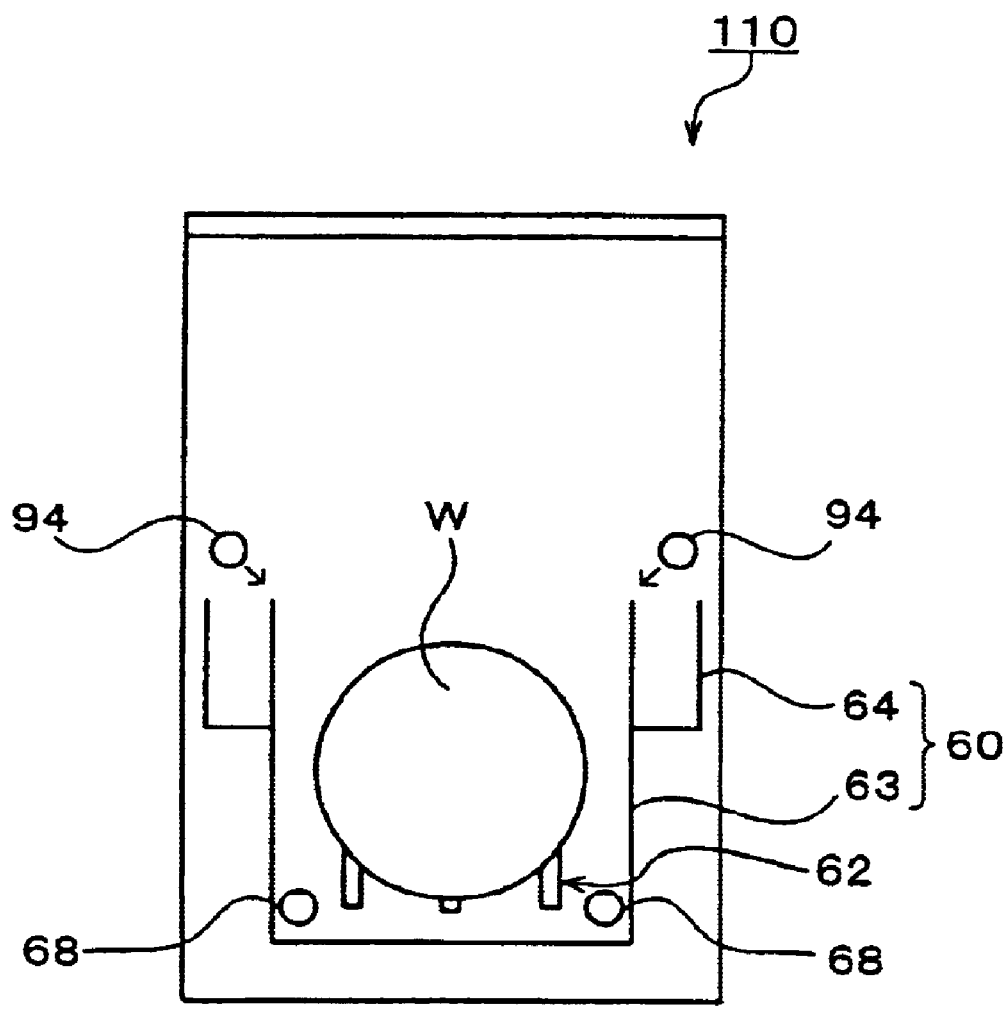
FIG. 15 is an illustration explaining the fourth step of the process performed by the rinsing/drying unit shown in FIG. 11.

Firstly, the processing steps from the step of receiving wafers to the step of submerging the wafer in dichloromethane as shown in FIG. 13 are executed in the same manner as the process using the rinsing/drying unit 21. Next, hot $N_2$ gas is discharged from the gas nozzles 94, 94 so that the processing bath 60 is surrounded by an $N_2$ atmosphere. Next, as shown in FIG. 14, dichloromethane is drained from the inner bath 63 (S4 shown in FIG. 12). As the liquid level lowers, the wafers W are exposed. Dichloromethane remaining on the surface of each exposed wafer W is evaporated. As shown in FIG. 15, dichloromethane is almost completely drained from the inner bath 63. Hot $N_2$ gas may be fed onto the wafers W in order to promote drying (S5 shown in FIG. 12). Thereafter, the wafer guide 62 moves up, and the wafers W are removed from the rinsing/drying unit 21.

Like the rinsing/drying unit 21, this rinsing/drying unit 110 can also perform the drying process in safety without producing water marks and pattern breakage of a resist film deposited on the wafers W. The periphery of the lower part of each wafer W can be easily dried.

Next, a rinsing/drying unit 120, which is the third embodiment of the present invention, will be described. The above-mentioned rinsing/drying units 21 and 110 feed a solvent having a specific gravity greater than that of pure water, while the rinsing/drying unit 120 feeds a solvent having a specific gravity smaller than that of pure water. The solvent has the same properties, as dichloromethane, except for the specific gravity being smaller than that of pure water, namely, it is nonflammable and does not dissolve a resist film.

Figure 16:
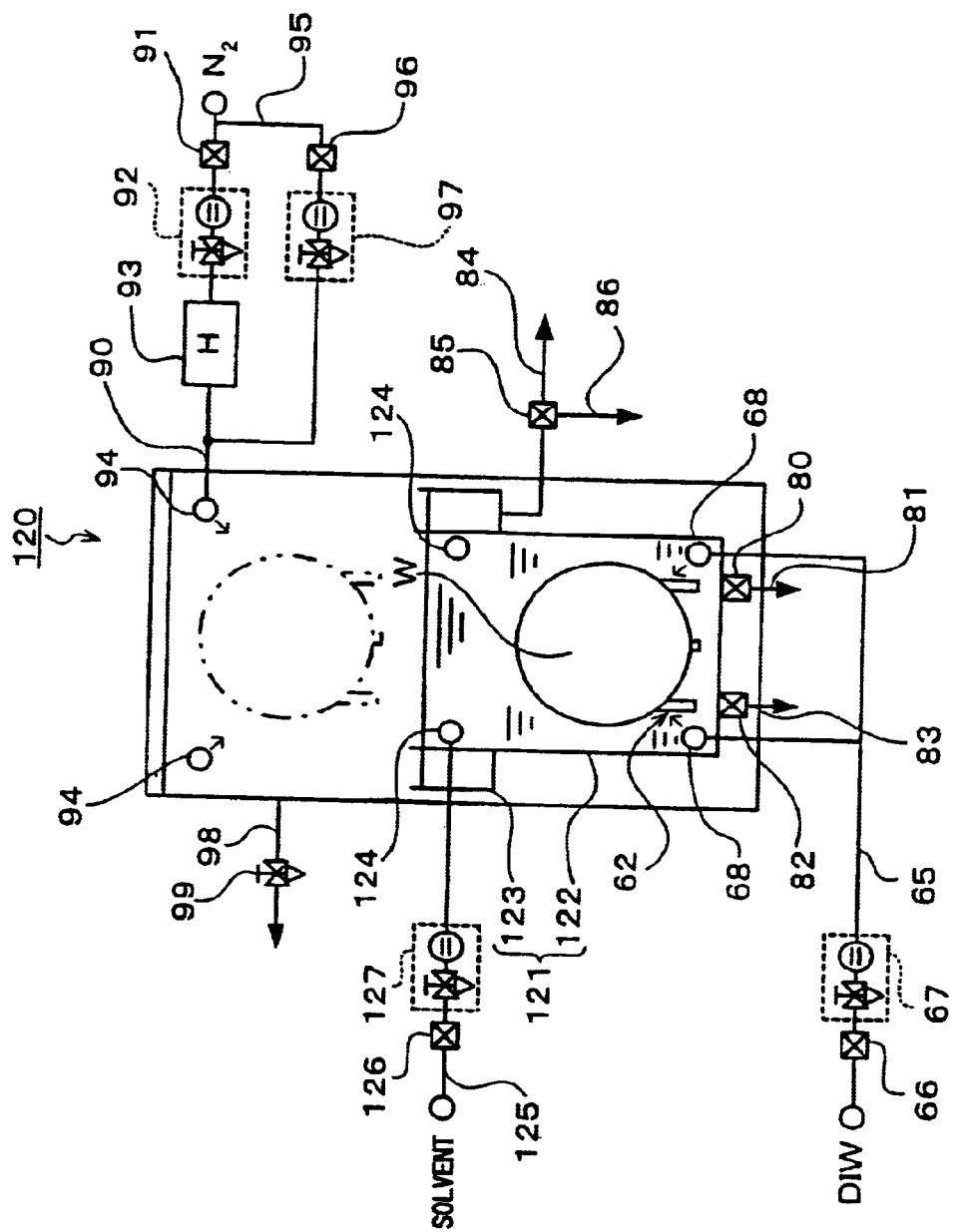
FIG. 16 is a piping flow diagram of rinsing/drying unit, which is the third embodiment of the present invention.

As shown in FIG. 16, a processing bath 121 has an inner bath 122 and an outer bath 123. Solvent nozzles 124, 124 are arranged in pairs at the upper portion of the processing bath 121. A solvent feed circuit 125 is connected to the solvent nozzles 124, 124. A solvent feed source, not shown, is connected to an inlet of the solvent feed circuit 125. An open-close valve 126 and a flow rate controller 127 are sequentially provided in the solvent feed circuit 125.

The process executed by the rinsing/drying unit 120 will be described referring to illustrations FIGS. 17 to 20 showing the processing steps 1 thru 4, respectively. The flow of process is basically the same as that executed by the rinsing/drying unit 21, and thus the flow chart of FIG. 4 will also be used for explanation.

Figure 17:
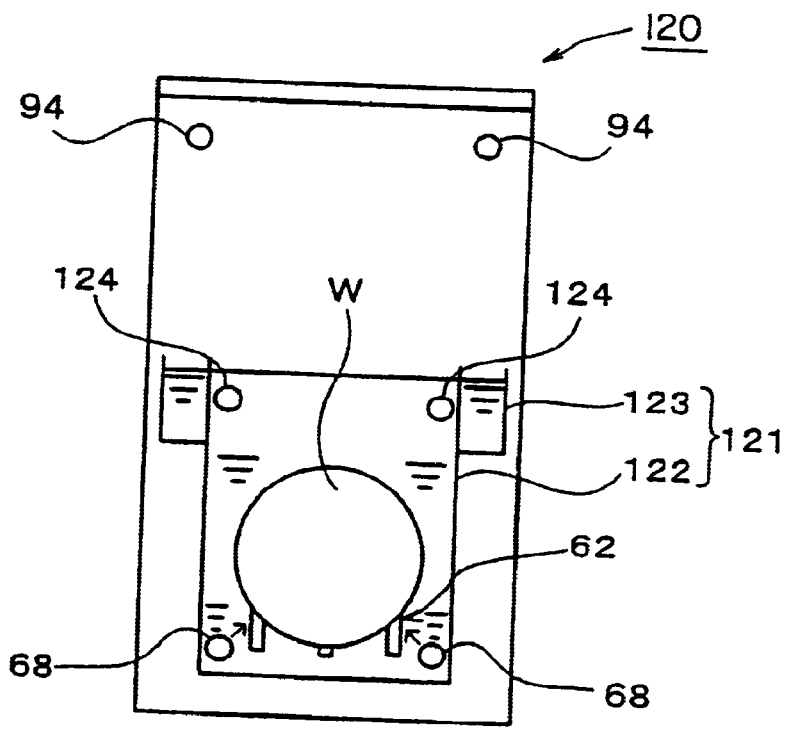
FIG. 17 is an illustration explaining the first step of the process performed by the rinsing/drying unit shown in FIG. 16.
Figure 18:
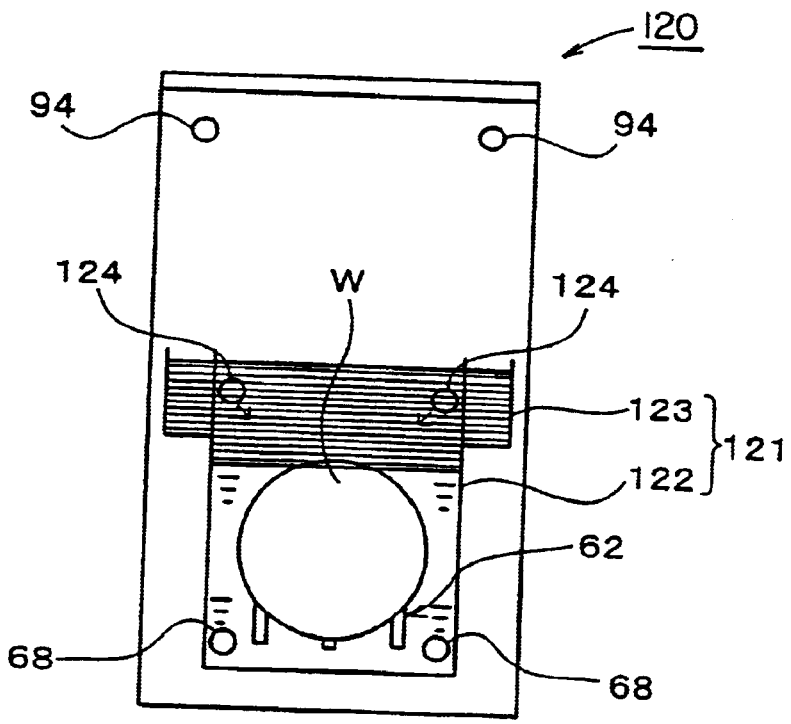
FIG. 18 is an illustration explaining the second step of the process performed by the rinsing/drying unit shown in FIG. 16.
Figure 19:
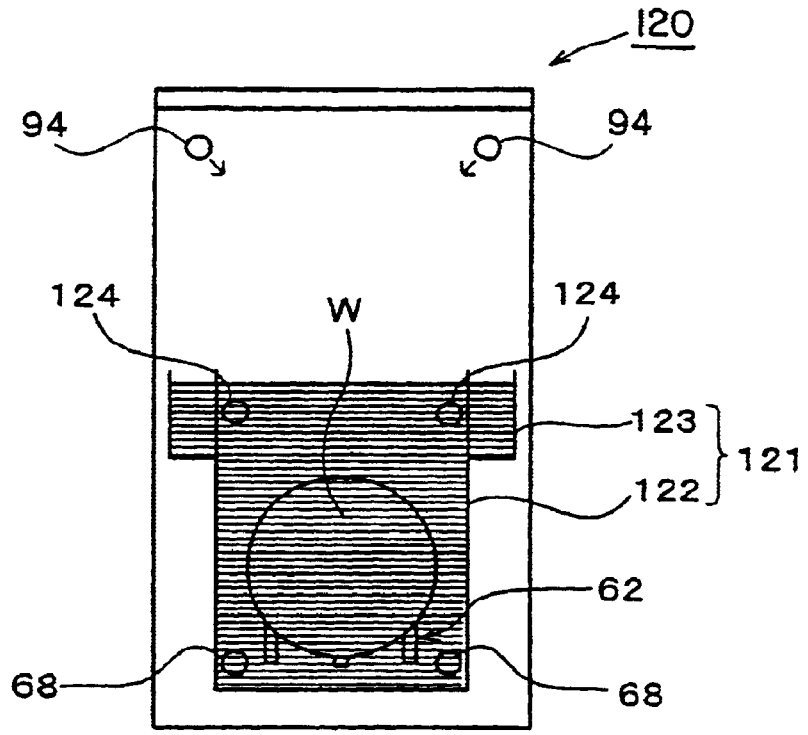
FIG. 19 is an illustration explaining the third step of the process performed by the rinsing/drying unit shown in FIG. 16.

Firstly, the processing steps from the step of receiving wafers to the step of submerging the water in pure water as shown in FIG. 17 are executed in the same manner as the process carried out by the rinsing/drying unit 21. After final rinsing, the open-close valve 126 is opened, and thus a solvent is fed into the inner bath 122, as shown in FIG. 18, by the solvent feed circuit 125 (S2 of FIG. 4). The solvent, the specific gravity of which is smaller than that of pure water, floats above the pure water occupying the upper part of the processing bath 121. Relative to feeding of the solvent, pure water is gradually drained from the inner bath 122 via a drain pipe 81 provided at the lower part of the processing bath 121. According to the above, a pure water layer and a solvent layer is formed in the inner bath 122. It is preferable that the feed rate of solvent be equal to the drain rate of pure water. The solvent is accumulated and the solvent layer thus becomes thicker, while pure water is drained from the inner bath 122 and the pure water layer thus becomes thinner. As shown in FIG. 19, pure water stored in the inner bath 122 is completely replaced with the solvent, and the wafers W are thus submerged in the solvent (S3 of FIG. 4). According to the above, when the specific gravity of a solvent is smaller than that of pure water, water contacting the wafer surface can also be replaced with a solvent with the wafers W being kept submerged in the liquids (pure water and the solvent) and without the wafers contacting the atmosphere.

Figure 20:
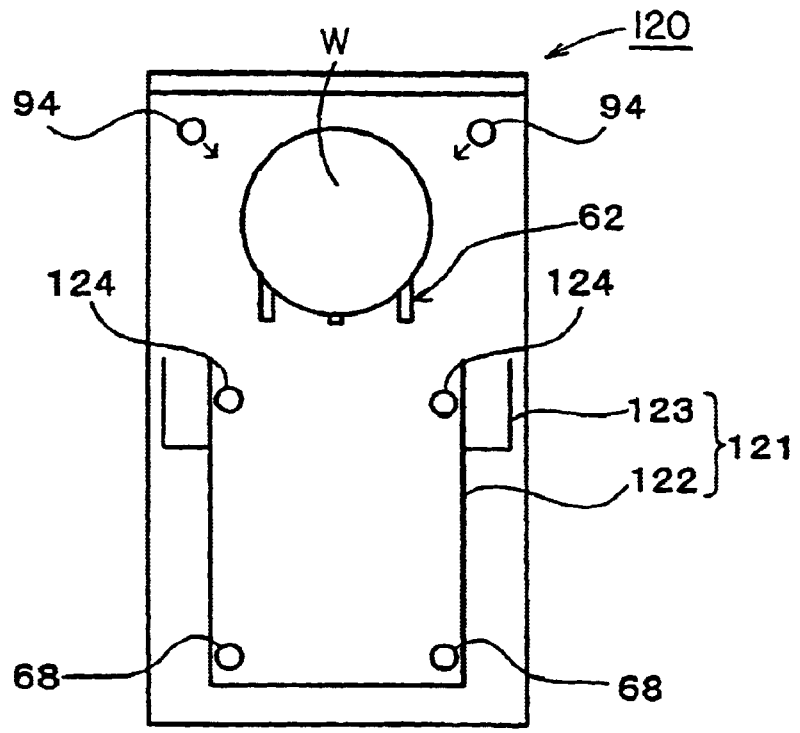
FIG. 20 is an illustration explaining the fourth step of the process performed by the rinsing/drying unit shown in FIG. 16.

After the replacement, as shown in FIG. 20, the wafer guide 62 moves up (S4 of FIG. 4), and then the solvent remained on the wafer surface is evaporated, and then $N_2$ gas at normal temperature or hot $N_2$ gas is discharged onto the surface of each wafer W (S5 of FIG. 4).

By use of the above rinsing/drying unit 120, the same effects as those obtained via usage of the rinsing/drying units 21 and 110 can be achieved.

In the rinsing/drying device 120, the wafers W can be covered by the solvent without completely draining pure water from the processing bath 121. Namely, the process step shown in FIG. 19 can be replaced with the process step shown in FIG. 21. As shown in FIG. 21, a solvent is fed into the processing bath 121 and pure water is drained therefrom, thereby forming a solvent layer thick enough to entirely cover the wafers W and the wafer guide 62 therein. The wafer guide 62 then moves up and the wafers W are covered by the solvent layer. According to the above, water contacting the surface of each wafer W can be replaced with a solvent without the wafers contacting with the atmosphere.

It is not necessary that the wafers W be kept still in the solvent layer. Namely, the status of the wafers W can be changed from a state in which the wafers W contact with pure water to a state in which the wafers W contact with the solvent, upon forming the solvent layer and then moving the wafers W upward so that the wafers W pass through the solvent layer.

Figure 22:
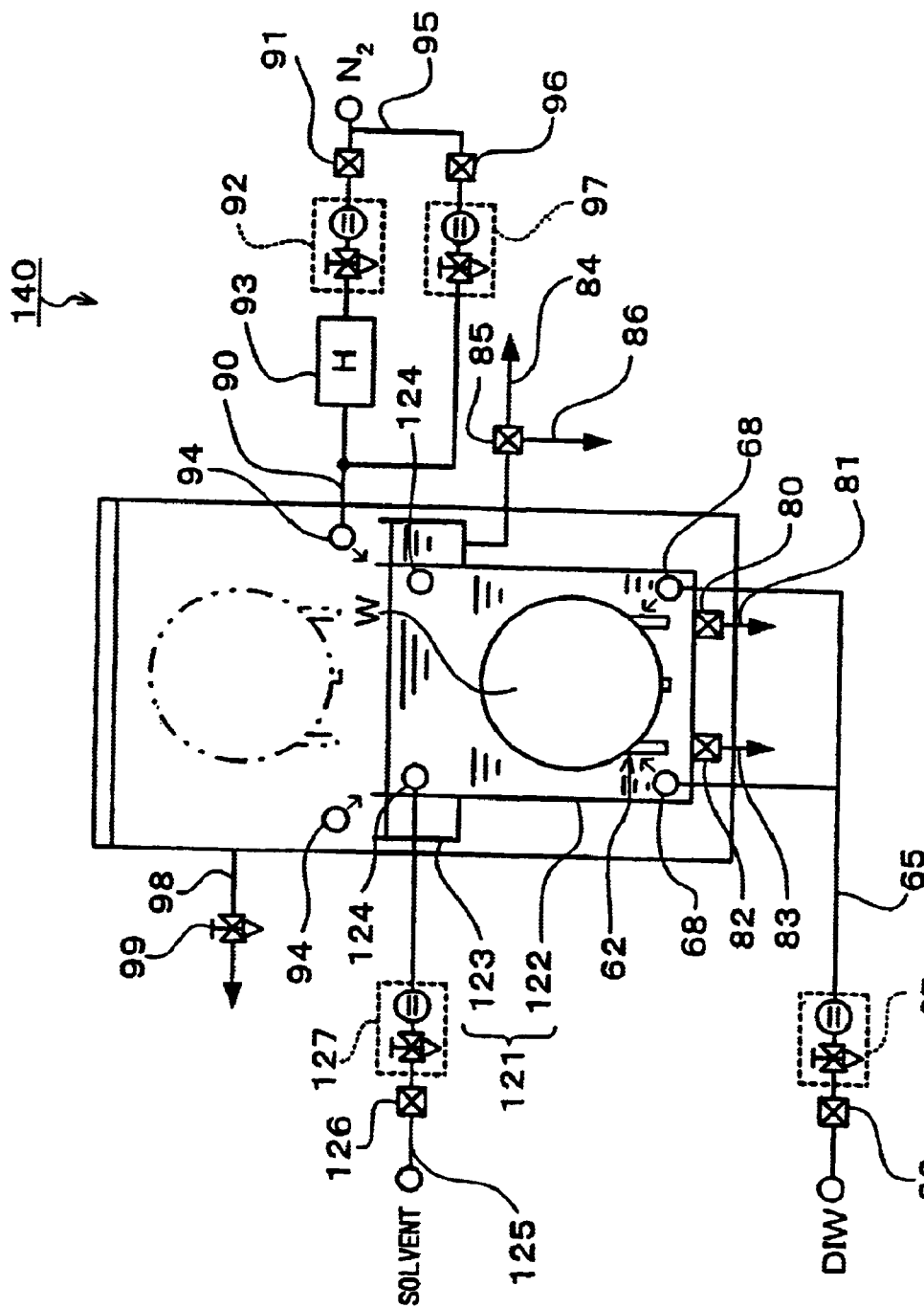
FIG. 22 is a piping flow diagram of a rinsing/drying device, which is the fourth embodiment of the present invention.

Next, a rinsing/drying unit 140, which is the fourth embodiment of the present invention, will be described. The rinsing/drying unit 140 is configured onto feed a solvent having a specific gravity smaller than that of pure water and feed $N_2$ gas at normal temperature or hot $N_2$ gas onto the wafers W into the processing bath 121. As shown in FIG. 22, the gas nozzles 94, 94 are arranged in pairs above the processing bath 121.

The process executed by the rinsing/drying unit 140 is basically the same as that executed by the rinsing/drying unit 110 explained upon referring to FIGS. 13 to 15.

Namely, firstly, the wafers W are submerged in the solvent, the solvent is drained from the inner bath 122, and then $N_2$ gas at normal temperature or hot $N_2$ gas is fed onto the wafers W in the processing bath 121. By use of the rinsing/drying unit 140, the same effect as those of the rinsing/drying units 21, 110 and 140 mentioned above can be obtained.

It should be noted that the present invention is not limited to the aforementioned embodiments and other various embodiments are possible. For example, the above-mentioned rinsing/drying units 21 and 110 feed dichloromethane (i.e., a solvent greater than pure water in specific gravity) from the lower part of the processing bath 60, however, such a solvent may be fed from the upper part of the processing bath 60. Furthermore, the rinsing/drying units 120 and 140 feed a solvent having a smaller specific gravity than that of pure water from the upper part of the processing bath 121, however, such a solvent may be fed from the lower part of the processing bath 121. Furthermore, the rinsing/drying units 21, 110, 120 and 140 may be may be structured as a unit of a so-called "one-bath" type, which can execute not only rinsing by pure water but also cleaning using a chemical liquid such as a fluoride acid. In this case, chemical liquid cleaning and pure water rinsing can be executed continuously in the processing bath 60, thereby saving foot print and improving throughput.

The present invention is applicable not only to a batch process that processes a plurality of substrates in a batch but also to a single-wafer type process that processes substrates one by one. The substrate may be an LCD substrate, a CD substrate, a printed substrate or a ceramic substrate, as well as a semiconductor wafer as exemplified above.

Figure 23:
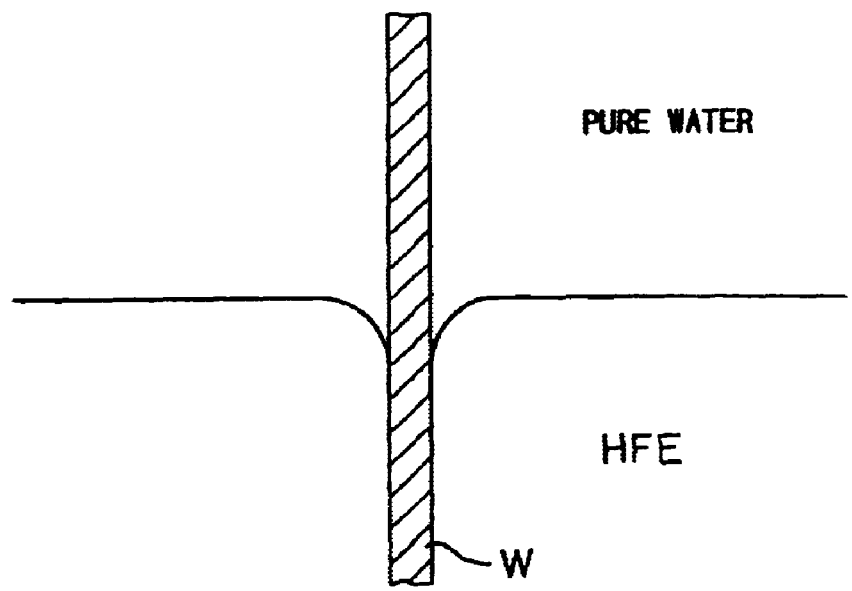
FIG. 23 is an illustration explaining a modification of the method of the present invention.

HFE (hydrofluoroether) which has a specific gravity greater than that of pure water, is hydrophobic, does not dissolve a resist film, is another example of the solvent liquid that can be used in the first and second embodiments. HFE-7100, provided by Sumitomo 3M Kabushiki Kaisha, is known as a commercially available HFE. When HFE is fed into the inner bath in the same manner as that of feeding HMDS or dichloromethane, the condition of the interface between HFE, pure water, and a wafer becomes as shown in FIG. 23. Namely, pure water lighter than HFE is positioned above HFE, and pure water enters into the HFE side in the neighborhood of an interface between the wafer and the liquids (HFE and pure water).

Under such conditions, even if the interface between the HFE and pure water is raised by further feeding HFE into the inner bath, it is possible that minute amounts of pure water remain on the wafer W, that is, minute amounts of pure water adhering to the wafer W are pulled in under the interface between the pure water and the HFE, and remains on the surface of the wafer W without being replaced with HFE.

The remaining pure water might produce water marks after raising the wafer from the HFE and before drying the wafer. To solve this problem, the interfaces between HFE, pure water and wafer W may be set as shown in FIG. 24 so that pure water is hardly pulled into the HFE side.

Figure 24:
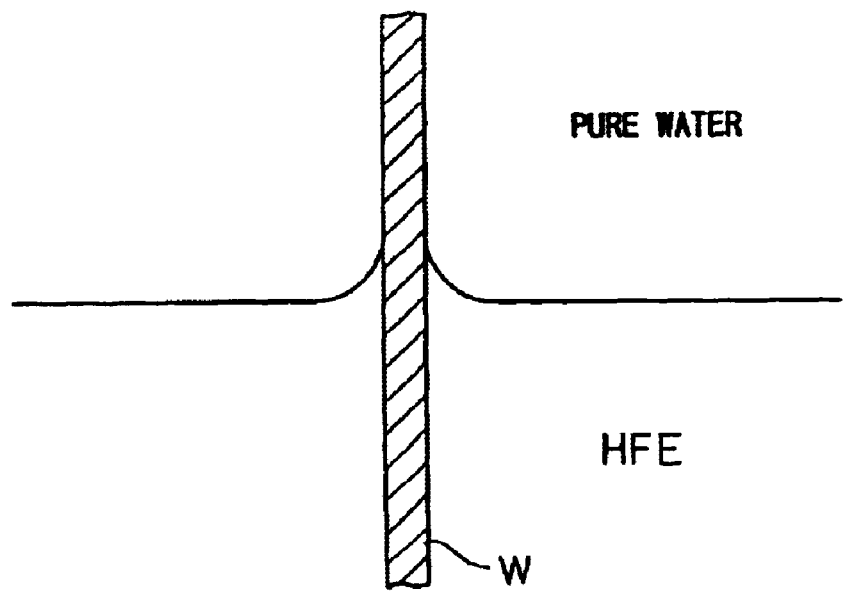
FIG. 24 is an illustration explaining a modification of the method of the present invention.
Figure 25:
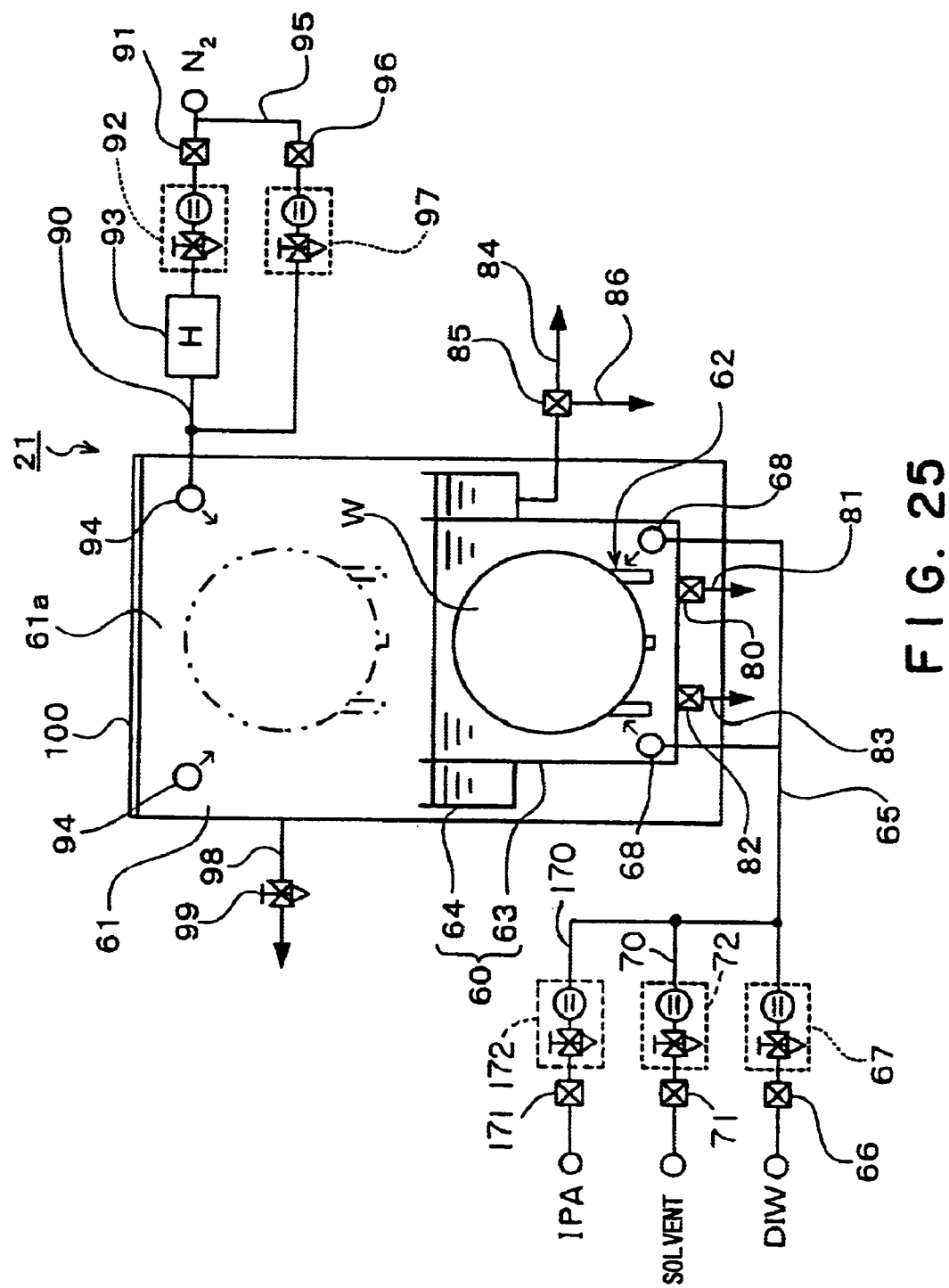
FIG. 25 is a piping flow diagram of a rinsing/drying unit that executes the method shown in FIG. 24.

As shown in FIG. 25, an IPA feed circuit 170 for feeding minute amounts of IPA (isopropyl alcohol) separately from HFE is available as one means for obtaining the interface condition as shown in FIG. 24. The IPA feed circuit 170 is composed of an IPA feed source connected to the solvent feed circuit 70, an open-close valve 171, and a flow rate controller 172.

When HFE mixed with a small amount of IPA is fed to the inner bath by the IPA feed circuit 170, a thin IPA film is formed between the pure water and the HFE. Then, the contact angle of the interface with the wafer is changed, and HFE enters into the pure-water side in the neighborhood of the interface between the wafer and the liquids (HFE and pure water).

In other words, the interface between the pure water and the HFE is inclined toward the upper side (i.e., toward the direction in which the interface between pure water and HFE moves during replacement of pure water with HFE in the inner bath,) as shown in FIG. 24. Therefore, when HFE is continuously fed so as to move the interface between the pure water and the HFE, the pure water is completely replaced with HFE with no pure water remaining on the wafer.

Figure 26:
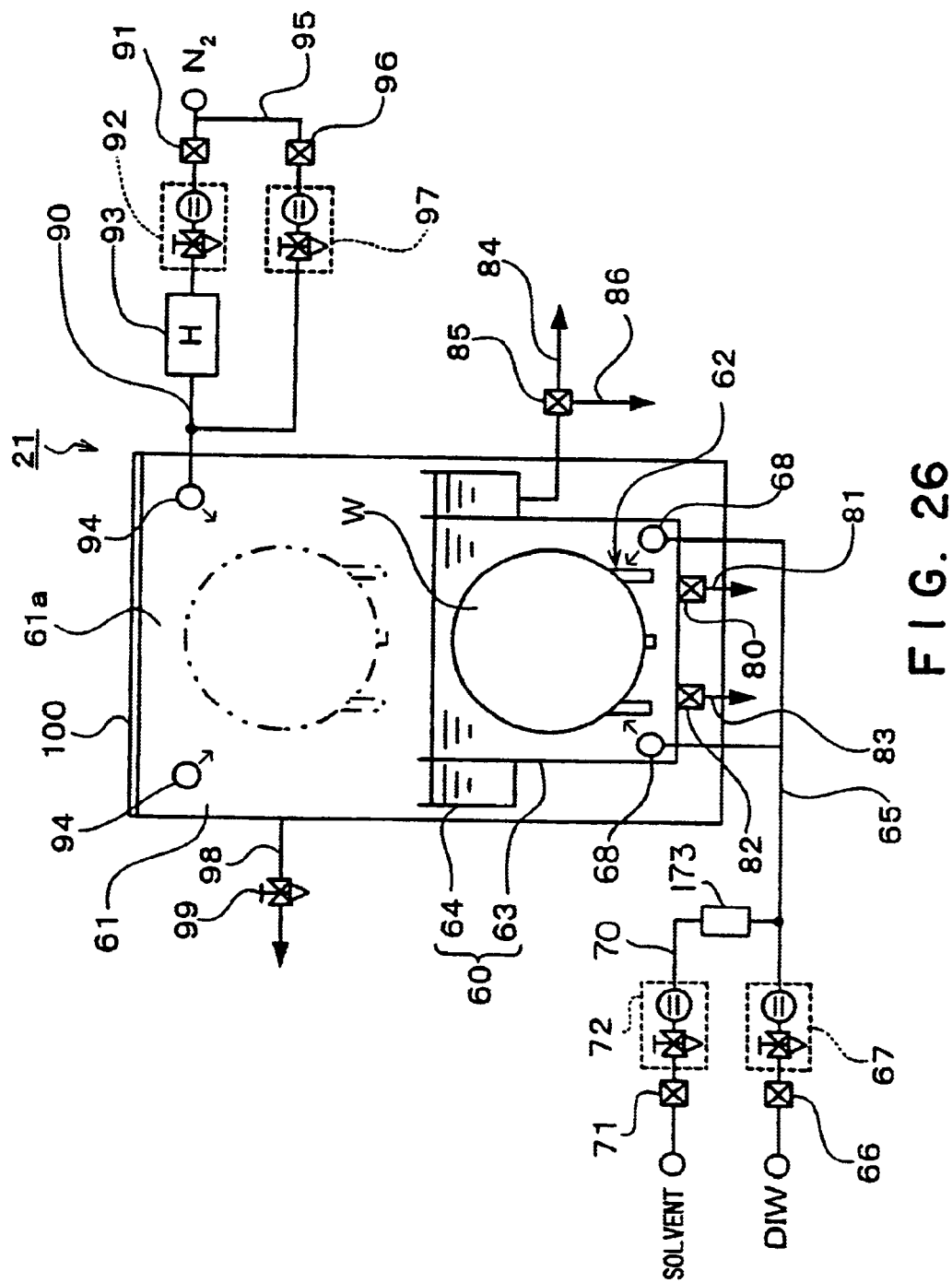
FIG. 26 is another piping flow diagram of a rinsing/drying unit that executes the method shown in FIG. 24.

As shown in FIG. 26, a solvent heating means for heating HFE may be used as alternative means for obtaining the above-mentioned effect. The solvent heating means comprises, for example, a heater 173 attached to the solvent feed circuit 70. HFE is heated by the solvent heating means and fed to the inner bath 63. Since the contact angle of the heated HFE and the wafer is changed, HFE enters into pure-water side in the neighborhood of the interface between the wafer and the liquids (HFE and pure water), as shown in FIG. 24. Therefore, when heated HFE is continuously fed so as to move the interface between pure water and HFE, pure water is completely replaced with HFE with no pure water remaining on the wafer.

What is claimed is:

1. A substrate rinsing and drying method comprising the steps of:

immersing a substrate, on which a resist film is formed, in water stored in a processing bath, thereby rinsing the substrate;

feeding a hydrophobic liquid having a specific gravity greater than water into the processing bath from a bottom portion of the processing bath, thereby forming a first layer of the water and a second layer of the hydrophobic liquid with an interface being formed therebetween, the hydrophobic liquid being incapable of dissolving the resist film and substantially insoluble in water;

further feeding the hydrophobic liquid into the processing bath from the bottom portion of the processing bath, thereby raising the interface so that the substrate passes through the interface and the substrate is entirely positioned in the second layer;

further feeding the hydrophobic liquid into the processing bath from the bottom portion of the processing bath, thereby causing the water contained in the processing bank to overflow therefrom and driving out the water in the processing bath entirely; and removing the substrate from the hydrophobic liquid after driving out the water in the processing bath entirely, thereby allowing the substrate to be dried.

2. The substrate rinsing and drying method according to claim 1, wherein the hydrophobic liquid is non-flammable.

3. The substrate rinsing and drying method according to claim 1, where the step of removing the substrate from the hydrophobic liquid is performed by raising the substrate to a position above the processing bath.

4. The substrate rinsing and drying method according to claim 3 further comprising a step of feeding a gas to the raised substrate to dry the substrate.

5. The substrate rinsing and drying method according to claim 1, wherein the step of removing the substrate from the hydrophobic liquid is performed by draining the hydrophobic liquid stored in the processing bath to a lower level of the hydrophobic liquid in the bath, while positioning the substrate within the processing bath.

6. The substrate rinsing and drying method according to claim 5 further comprising a step of feeding a gas to the substrate positioned within the processing bath to dry the substrate.

7. The substrate rinsing and drying method according to claim 1 further comprising a step of establishing an inert gas atmosphere around the substrate removed from the hydrophabic liquid.

8. The substrate rinsing and drying method according to claim 1, wherein the hydrophobic liquid is dichloromethane or hexamethyldisilazane.

* * * * *